(12) United States Patent
Albin et al.

(10) Patent No.: US 9,583,667 B2
(45) Date of Patent: Feb. 28, 2017

(54) SYSTEMS AND METHODS FOR FORMING SOLAR CELLS WITH CUINSE$_2$ AND CU(IN,GA)SE$_2$ FILMS

(71) Applicants: ALLIANCE FOR SUSTAINABLE ENERGY, LLC, Golden, CO (US); ABENGOA SOLAR NEW TECHNOLOGIES, S.A., Sevilla (ES)

(72) Inventors: David S. Albin, Golden, CO (US); Nirav Vora, Toledo, OH (US); Sebastian Caparros Jimenez, Sevilla (ES); Joaquin Murillo Gutierrez, Sevilla (ES); Emilio Sanchez Cortezon, Sevilla (ES); Manuel Romero, Littleton, CO (US)

(73) Assignees: Alliance for Sustainable Energy, LLC, Golden, CO (US); Abengoa Solar New Technologies, S.A., Sevilla (ES)

( * ) Notice: Subject to any disclaimer, the term of this patent is extended or adjusted under 35 U.S.C. 154(b) by 147 days.

(21) Appl. No.: 14/382,106

(22) PCT Filed: Feb. 27, 2013

(86) PCT No.: PCT/US2013/028078
§ 371 (c)(1),
(2) Date: Aug. 29, 2014

(87) PCT Pub. No.: WO2013/130652
PCT Pub. Date: Sep. 6, 2013

(65) Prior Publication Data
US 2015/0079724 A1 Mar. 19, 2015

Related U.S. Application Data

(60) Provisional application No. 61/604,792, filed on Feb. 29, 2012.

(51) Int. Cl.
*H01L 31/18* (2006.01)
*C23C 16/455* (2006.01)
(Continued)

(52) U.S. Cl.
CPC .......... *H01L 31/18* (2013.01); *C23C 14/0623* (2013.01); *C23C 14/22* (2013.01);
(Continued)

(58) Field of Classification Search
None
See application file for complete search history.

(56) References Cited

U.S. PATENT DOCUMENTS 5,356,839 A 10/1994 Tuttle et al.
5,436,204 A 7/1995 Albin et al.
(Continued)

FOREIGN PATENT DOCUMENTS

WO WO 2008/085604 A2 7/2008

OTHER PUBLICATIONS

Abe, et al., "Development of Flexible Cu(In,Ga)Se2 Thin Film Solar Cell by Lift-Off Process," Solar Cells—Thin-Film Technologies, edited by Leonid A. Kosyachenko, Publisher InTech, Published Nov. 2, 2011 Chapter 19, pp. 405-420.
(Continued)

*Primary Examiner* — Mary Wilczewski
*Assistant Examiner* — Erik T Peterson
(74) *Attorney, Agent, or Firm* — Suzanne C. Walts

(57) ABSTRACT

Systems and methods for forming solar cells with CuInSe$_2$ and Cu(In,Ga)Se$_2$ films are provided. In one embodiment, a method comprises: during a first stage (220), performing a mass transport through vapor transport of an indium chloride (InCl$_x$) vapor (143, 223) and Se vapor (121, 225) to deposit a semiconductor film (212, 232, 252) upon a substrate (114, 210, 230, 250); heating the substrate (114, 210, 230, 250)
(Continued)

and the semiconductor film to a desired temperature (112); during a second stage (240) following the first stage (220), performing a mass transport through vapor transport of a copper chloride ($CuCl_x$) vapor (143, 243) and Se vapor (121, 245) to the semiconductor film (212, 232, 252); and during a third stage (260) following the second stage (240), performing a mass transport through vapor transport of an indium chloride ($InCl_x$) vapor (143, 263) and Se vapor (121, 265) to the semiconductor film (212, 232, 252).

8 Claims, 5 Drawing Sheets

(51) Int. Cl.
  *C23C 16/46* (2006.01)
  *C23C 16/44* (2006.01)
  *C23C 16/30* (2006.01)
  *C23C 14/22* (2006.01)
  *C23C 14/06* (2006.01)
  *H01L 21/02* (2006.01)
  *H01L 31/032* (2006.01)

(52) U.S. Cl.
  CPC ............ *C23C 16/305* (2013.01); *C23C 16/44* (2013.01); *C23C 16/455* (2013.01); *C23C 16/46* (2013.01); *H01L 21/02422* (2013.01); *H01L 21/02491* (2013.01); *H01L 21/02568* (2013.01); *H01L 21/02614* (2013.01); *H01L 21/02631* (2013.01); *H01L 31/0322* (2013.01); *Y02E 10/541* (2013.01)

(56) References Cited

U.S. PATENT DOCUMENTS

| | | |
|---|---|---|
| 5,441,897 A | 8/1995 | Noufi et al. |
| 5,731,031 A | 3/1998 | Bhattacharya et al. |
| 6,518,086 B2 | 2/2003 | Beck et al. |
| 7,858,151 B2 | 12/2010 | Sager et al. |
| 8,501,524 B2 | 8/2013 | Cho et al. |
| 2007/0184576 A1 | 8/2007 | Chang et al. |
| 2009/0304924 A1* | 12/2009 | Gadgil ................ C23C 16/4412 427/255.5 |
| 2010/0236630 A1 | 9/2010 | Kim et al. |
| 2010/0248419 A1 | 9/2010 | Woodruff et al. |
| 2011/0120545 A1 | 5/2011 | Auman et al. |
| 2011/0139251 A1 | 6/2011 | Robinson et al. |
| 2011/0189815 A1 | 8/2011 | Sager et al. |
| 2011/0312122 A1 | 12/2011 | Lee |
| 2013/0130475 A1 | 5/2013 | Barden et al. |
| 2013/0230933 A1 | 9/2013 | Li |

OTHER PUBLICATIONS

Albin, et al., "The Formation of Large-Grain CuInSe2 Films by Selenization by High-Rate Se Transport Under Moderate Vacuum Conditions," Journal of Electronic Materials, vol. 24, No. 4, Apr. 1995, pp. 351-357.

Malik, S.N., "Preparation of CuInSe2 and CuInGaGe2 nanoparitcles and thin films for solar cells applications," A Thesis submitted to the University of Manchester, School of Chemistry, The University of Manchester 2010.

Ramanathan, K. et al., "High-Efficiency Cu(In,Ga)Se2 Thin Film Solar Cells Without Intermediate Buffer Layers," NRWL/CP-520-23898, presented at the 2nd World Conference and Exhibition on Photovoltaic Solar Energy Conversion, Jul. 6-10, 1998, Vienna, Austria.

Romeo, A. et al., "Development of Thin-film Cu(In,Ga)Se2 and CdTe Solar Cells," Progress in Photovoltaics: Research and Applications, vol. 12, Issue 2-3, May 2004, pp. 93-11.

International Search Report and Written Opinion dated Jun. 17, 2013 for PCTUS2013/028078 filed Feb. 27, 2013.

* cited by examiner

SYSTEMS AND METHODS FOR FORMING SOLAR CELLS WITH CUINSE$_2$ AND CU(IN,GA)SE$_2$ FILMS

CROSS REFERENCE TO RELATED APPLICATIONS

This application claims priority to, and claims benefit of, U.S. Provisional Application 61/604,792, entitled "SOLAR CELLS WITH CUINSE$_2$ AND CU(IN,GA)SE$_2$ FILMS MADE BY REACTING EVAPORATED COPPER, INDIUM, AND GALLIUM CHLORIDES WITH SELENIUM", filed Feb. 29, 2012.

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

Solar cells are devices that have characteristics that enable them to convert the energy of sunlight into electric energy. The aim of research often is to achieve solar cell designs that are suitable for inexpensive commercial production while providing acceptably high energy conversion efficiencies.

A conventional thin film solar cell is composed of a stacking of thin layers on a rigid or flexible substrate, and the thin layers form one or more junctions that absorb light and convert it into electricity. Briefly, a typical thin film PV device such as a thin film solar cell may include a glass, metal, or polymer substrate, a back contact, an absorber, a window layer, a front contact or low resistivity layer, and a top protective layer (e.g., a glass substrate) or a similar arrangement of thin film layers. Presently, many thin film solar cells are fabricated with an absorber or absorber layer formed of copper indium diselenide ("CIS") or copper indium gallium diselenide ("CIGS") because an absorber formed of either material has a high optical absorption coefficient and suitable optical and electrical characteristics. With regard to CIS and CIGS solar cells, work continues to provide better methods of producing a CIS or CIGS thin film layer that is of proper composition and structure to allow charges generated by received sunlight (i.e., electrons and holes) to exist long enough in the CIS and CIGS layer of the device so that they can be separated and collected at the front and back contacts to provide higher conversion efficiency.

Commercial production of solar cells includes growth of thin films including a CIS or CIGS absorber using a variety of processes. A coevaporation process may be used to produce a thin film by concurrently evaporating copper (Cu), indium (In), gallium (Ga), and selenium (Se) from elemental sources. Even with precise control over evaporation rates, it has proven difficult to obtain a homogenous thin film with a desired roughness and uniform thickness. In other commercial production lines, selenization from selenium vapor is used to form the CIS or CIGS absorber for a solar cell. In a typical process, a substrate is provided that is a soda lime glass coated with a thin film of molybdenum (Mo), as the back contact of the solar cell. Cu, In and Ga layers are sequentially deposited on the substrate by a vapor deposition process such as sputtering. The different layers are thermally selenized in an H$_2$Se or Se-containing atmosphere and then converted into a CIS or CIGS thin film. An advantage of this process compared with the coevaporation process is that large area depositions of CIS or CIGS films can be produced commercially.

Researchers studying techniques for fabricating higher efficiency solar cells designed an improved method of forming a Cu(In,Ga)Se$_2$ film. Particularly, a three-stage process is taught in U.S. Pat. No. 5,441,897 by Noufi, and its teaching may be relied upon to more fully understand aspects of the methods taught for forming thin films. Briefly, the three stages include: deposition to form a thin film of In$_x$Se; addition of copper to the In$_x$Se film to form a Cu-rich CIS film; and addition of In$_x$Se to the Cu-rich CIS film to form a Cu-poor CIS film. It has been shown that a CIS (or CIGS) film provides a more effective absorber in a solar cell when there is a less than one-to-one ratio of the copper to indium (Cu-poor) at or near the surface of the absorber that abuts the window or provides the junction with the cadmium sulfide (CdS) or other thin film of the solar cell.

To date, though, solar cell manufacturers have found it difficult to form a Cu-rich CIS or CIGS thin film and then selectively reduce the amount of copper to form a Cu-poor region (e.g., a Cu-poor surface at CIS/CdS junction or interface). Some efforts have been made to utilize copper to substitute for indium in the step of forming a Cu-rich CIS thin film. However, this involves a chemical process or chemical vapor deposition (CVD) requiring very high temperatures (e.g., 1200° C. or the like), which are undesirable in commercial production settings as it increases energy costs and requires significant engineering to provide the high temperature CVD environment.

Embodiments described herein address problems in the state of the art, as will become evident by studying this disclosure. The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

Briefly, methods of fabricating CuInSe$_2$ (CIS) and Cu(In,Ga)Se$_2$ (CIGS) films for solar cells are described. In one or more example embodiments, CIS or CIGS films are made by reacting evaporated copper, indium, and (for CIGS films) gallium chlorides with selenium. In one example embodiment, first a film of In$_x$Se may be deposited upon a substrate (which may be a structural foundation such as a glass substrate with a back contact such as a coating of molybdenum, for example). Second, a Cu-poor or Cu-rich film is formed by heating the substrate and In$_x$Se film (e.g., to 475 to 525° C.) and performing mass transport through vapor transport in a reaction chamber. The mass transport may use a source of a copper chloride (e.g., a CuCl$_x$ species where x>0, but typically x=1, 2 or 3) that is heated to a relatively low temperature (e.g., 274 to 310° C. or higher) and also a source of selenium to provide an overpressure of Se in the reaction chamber. Third, when a Cu-rich film is formed in the second step or stage, a Cu-poor film is formed such as by providing a source of In$_x$Cl vapor with an overpressure of Se in the reaction chamber.

The thin film deposition may be described as a hybrid physical and chemical deposition reaction where the reactants are not byproducts of a reaction. Instead, the reactants are physically transported to the reactor to facilitate the desired chemical reaction in the thin film to form a Cu-poor CIS or CIGS film. In the thin film deposition process, the copper chloride is used to allow low temperatures to be used to obtain high rates of mass transport as the process involves going directly from solid to vapor (for example, to provide a carrier gas/vapor of $CuCl_x$), which can be provided using a hot injector such as a lateral injector.

In addition to the exemplary aspects and embodiments described above, further aspects and embodiments will become apparent by reference to the drawings and by study of the following descriptions.

BRIEF DESCRIPTION OF THE DETAILED DRAWINGS

Exemplary embodiments are illustrated in referenced figures of the drawings. It is intended that the embodiments and figures disclosed herein are to be considered illustrative rather than limiting.

In accordance with common practice, the various described features are not drawn to scale but are drawn to emphasize relevant features. Reference characters denote like elements throughout Figures and text.

DETAILED DESCRIPTION

Figure 1:
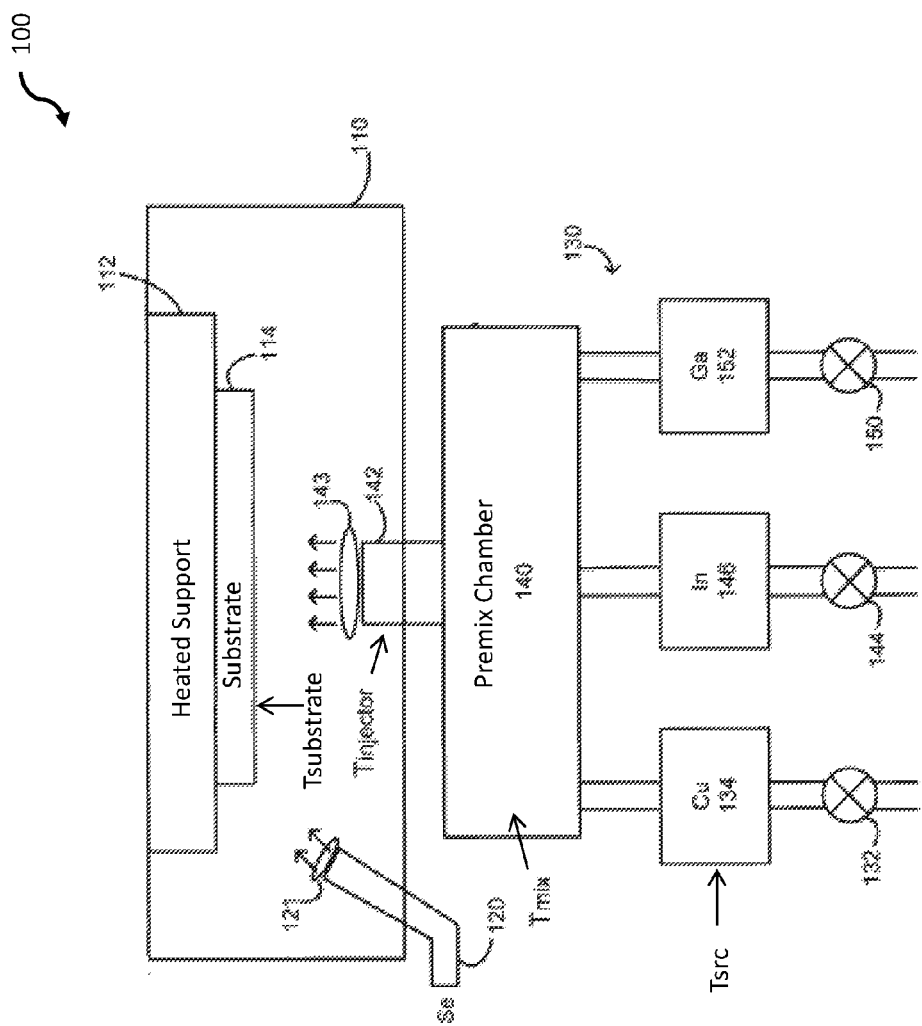
FIG. 1 is a functional block drawing or schematic of a deposition assembly or system operable to fabricate a solar cell (or a portion thereof) including forming a CIS or CIGS film with a Cu-deficient region.

The following description is directed generally to a method of fabricating solar cells with a CIS or CIGS thin film or absorber with a copper (Cu)-poor region. More particularly, the following description teaches a method for manufacturing $CuInSe_2$ and $Cu(In,Ga)Se_2$ films for solar cells, and the method includes reacting evaporate copper chlorides (which in this disclosure refers to a $CuCl_x$ species where x>0, but typically x=1, 2 or 3, and may further, in some embodiments, include species of $Cu_yCl_x$, where y,x>0), indium chlorides (which in this disclosure refers to a $InCl_x$ species where x>0, but typically x=1, 2 or 3), and, in some cases, gallium chlorides (which in this disclosure refers to a $GaCl_x$ species where x>0, but typically x=1, 2 or 3) with selenium. The various embodiment described herein are designed with the recognition of the desirability of making the thin film copper poor (that is, the ratio of Cu to (In+Ga) is less than 1) such as with 19 to 24.5 at % Cu in a region or near the surface opposite the substrate/back contact.

Using elemental copper to replace indium in a film of $In_xSe$, but such a chemical reaction requires very high temperatures (e.g., 1200° C. and higher) to heat the Cu. In contrast, the embodiments described herein utilize vapor deposition or physical processes, for example, to provide copper to an $In_xSe$ thin film by heating copper chloride ($CuCl_x$) to provide $CuCl_x$ vapor. The method provides a high growth rate of the thin film (micrometers per minute rather than merely angstroms per second) by providing a high mass transport rate (e.g., due in part to the high vapor pressure of $CuCl_x$) and an acceptable reaction rate (e.g., to limit the amount of release or loss of InCl). The method may be described as using vapor transport (or physical transport) and then chemical reaction in the film to provide physical and chemical deposition that differs from typical CVD. The use of vapor transport can be applied to commercial deposition techniques such as hot injectors (e.g., lateral injectors or the like), which improves the resulting spatial and/or compositional uniformity in the film as it provides "pre-mixing" upstream of the reaction chamber in contrast to co-evaporation processes in which mixing occurs only within the reaction chamber.

Polycrystalline thin films of p-type $CuInSe_2$ and $Cu(In, Ga)Se_2$ produce high efficiency heterojunction solar cells when the composition of the film at the corresponding interface with the n-type window layer (e.g., CdS+ZnO) is not stoichiometric, but, rather, it is desirable that the composition be slightly Cu deficient (or a Cu-poor region). A stoichiometric $CuInSe_2$ composition would, for example, be 25 at % Cu, 25 at % In, and 50 at % Se while a corresponding Cu-deficient composition would involve Cu concentrations of approximately 19 to 24.5 at %.

One useful method of forming such Cu-deficient films includes heating $In_xSe$ films deposited on molybdenum (Mo)-coated glass substrates. The molybdenum film or coating provides the back metallic conductor of a solar cell formed with the Cu-deficient film, and the method of depositing the Mo and then the $In_xSe$ may be varied to practice the method described herein. The method further includes exposing these films to vapors from heated sources of solid $CuCl_x$ and molten selenium. The concentration of selenium in both the starting $In_xSe$ film as well as the subsequent vapor treatment ($CuCl_x$+Se vapor) determines the resulting composition of the thin film.

Under some conditions, the composition of the film remains Cu-deficient regardless of how much $CuCl_x$ is used in the subsequent vapor treatment step. This compositionally self-regulating method represents a two-stage process that can readily be adopted by commercial manufacturers. Specifically, the resulting Cu-poor film can be used to fabricate high efficiency $CuInSe_2$ or $Cu(In,Ga)Se_2$ solar cells. In this method, the high vapor pressure of $CuCl_x$ can be used as a way to maintain the desired Cu-poor nature of the surface (e.g., the surface layer used as a junction or contact surface for the n-type window of a solar cell).

In another useful method or other conditions (different temperatures and selenium activity), the composition of the film can be intentionally made Cu-rich. Such a three-step or stage process for providing the thin film may be used when it is desired to provide an absorber or thin film with a copper-content gradient from Cu-rich near the back contact (for example, Cu to (In+Ga) ratio greater than 1 near the Mo coating on the glass substrate) to Cu-poor near the n-type window junction surface. For example, the methods described in U.S. Pat. No. 5,441,897 may be modified such that Cu-rich $CuInSe_2$ or $Cu(In,Ga)Se_2$ film is formed using the above-described technique involving vapor transport using $CuCl_x$ and Se. The Cu-rich film is then made Cu-deficient by treating it in a flux of In and Se simultaneously and described with respect to the present FIGS. 1 and 2A-2C and the descriptions below.

From the teachings of this disclosure, $CuCl_x$ as a source of copper for creating a CIS or CIGS film has a number of technological advantages when compared with solid or elemental copper. First, due to its high vapor pressure, CuCl only needs to be heated to much lower temperature ranges such as 375 to 400° C. to get useful amounts of mass transport for thin film formation. Particularly, CuCl heated to 300° C. provides the same mass transport as Cu heated to 1200° C. Providing vapor transport at relatively low heating (or injector or injector assembly) temperatures represents a considerable cost-savings with regard to equipment design complexity and operational and maintenance costs. Second, when used in this form (i.e., $CuCl_x$ vapor), copper can be incorporated in hybrid physical-chemical deposition reactions where sequential physical and chemical reactions can be separated. Initially, $CuCl_x$ is physically transported and directed (e.g., to an injector) as a non-reacting vapor by application of moderate heat (~300° C.) between the CuCl source and the substrate (e.g., the Mo-coated glass substrate upon which a thin film of $In_xSe$ has previously been formed/deposited). The heat can also be applied to the delivery of In and Ga chloride vapors. This allows for transporting Cu, In, and Ga using lateral and other injector designs for improved cross-web compositional uniformity in the thin film (e.g., solar cell absorber). After physical transport, the Cu, In, and Ga fluxes are chemically reacted with an overpressure of Se (i.e., a concentration greater than that needed to attain stoichiometry) at the heated substrate surface. In this manner, $Cu_xSe$, $In_xSe$, or $In_xGa_{1-x}Se$ films are formed. These layers can be subsequently used to make high efficiency $CuInSe_2$ and $Cu(In,Ga)Se_2$ solar cells.

FIG. 1 illustrates an exemplary system or assembly 100 useful for forming a solar cell or at least forming a CIS or CIGS film on a substrate for use in fabricating a solar cell. The system 100 may be used as a small scale laboratory system or similar device in which a moving line or belt is implemented. In the system 100, a single injector 142 is used to deposit in sequential order a layer or film of $In_xSe$ or $(In,Ga)_xSe$, a layer or film of $Cu_xSe$, and then a layer or film of $In_xSe$ or $(In,Ga)_xSe$. In the system 100, the metals or metal reactants such as Cu, In, and, in some cases, Ga reacts with the selenium (Se) at the substrate to achieve an improved result. Further, spatial and compositional uniformity is enhanced, when compared with co-evaporation and other techniques, through the use of a premix chamber 140 provided upstream of the injector 142 for mixing the Cu, In, and Ga vapors prior to their injection as a mixed or combination reactant gas 143 into the reaction chamber 110. By having a premix chamber, such as premix chamber 140, various embodiments of the present disclosure may inject a given ratio of In and Ga onto a substrate without segregation of the In and Ga occurring on the substrate.

As shown, the system 100 includes a reaction chamber 110 that may be configured to provide an enclosed space with controllable pressures. The chamber 110 includes a heater or heated support 112, and the system 100 is shown during use with a substrate 114 positioned upon the heater 112. The substrate 114, for example, may be a glass substrate coated with a thin film for use as a back contact such as a Mo coating. The substrate 114 is then subjected to additional processing steps to form a Cu-poor CIS or CIGS film as discussed below. The substrate 114 may be heated to a wide range of temperatures during the deposition steps, with some implementations indicating substrate temperatures, $T_{Substrate}$, in the range of 475 to 525° C. (e.g., 500 to 515° C. or the like) are useful or desirable when adding copper into a film of $In_xSe$ to provide a Cu-deficient or Cu-rich film.

A Se supply or overgas supply line 120 is provided in the system 100 to provide an overpressure of selenium vapor during each deposition step.

The system 100 further includes a reactant gas supply assembly 130 that includes a copper source 134, an indium source 146, and a gallium source 152. For example, copper chloride, indium chloride, and gallium chloride, in solid form, may be provided in chambers 134, 146, 152, respectively, which each may be heated to a source reactant chamber temperature, $T_{src}$, which is high enough to change these solid chlorides into vapor. A carrier gas may be selectively delivered to each chamber 134, 146, 152 via inlet valves 132, 144, 150 to control the flow rate of reactant chloride vapors into a premix chamber 140 and into the reaction chamber 110. The temperature, $T_{src}$, typically will be relatively low such as 275 to 325° C. during deposition steps using the chambers 134, 146, 152.

The reactant gas supply assembly 130 further includes a premix chamber 140 in fluid communication with the chambers 134, 146, 152 to receive the reactant vapors including Cu, In, and Ga. At differing points in the operation of the system, one, two, or all three of the valves 132, 144, 150 will be opened to deliver reactant vapor to the premix chamber 140, and these reactant gases are mixed in the premix chamber 140 where heat may also be provided to maintain ($T_{mix}=T_{src}$) or raise ($T_{mix}>T_{src}$) the temperature of the mixing vapors. The premixed reactant vapors are then injected or fed into the reaction chamber 110 via a hot injector 142 as shown at 143, with the hot injector 142 also being heated such as to a temperature at least about that of the chambers 134, 146, 148 (i.e., $T_{injector}$ is greater than or equal to about $T_{src}$).

In forming a CIS or CIGS film, the single injector 142 may be used to first deposit $In_xSe$ on the substrate 114 by using the supply line 120 to provide a flow of selenium vapor 121 into the chamber 110 and to concurrently operate valve 144 to provide a flow 143 of indium chloride into the chamber 110. In an alternate first stage or step, $(In,Ga)_xSe$ is deposited upon the Mo-coated substrate 114 by providing the Se vapor 121 along with a mixture 143 of indium chloride and gallium chloride from sources 146, 152 by opening valves 144 and 150.

The second stage or step may involve operating the system 100 to form a Cu-rich CIS or CIGS film. In the both of the examples provided above, this would include using the supply line 120 to provide an overpressure of Se vapor 121 and then also operating the valve 132 to provide a reactant gas 143 via injector 142, with the reactant gas 143 being copper chloride vapor from chamber 134. The resulting CIS or CIGS film may be Cu-deficient, and no further deposition steps would be required to use the film in a solar cell.

In forming other devices with substrate 114, the CIS or CIGS film may be Cu-rich after this second deposition step/stage. In such cases, and a third operating step may be performed with the system 100 to deposit $In_xSe$ (in the first example above) or to deposit $(In,Ga)_xSe$. This involves providing the Se vapor 121 from supply line 120 while concurrently either opening just the valve 144 to provide indium chloride vapor via injector 142 or both valves 144 and 150 to provide a mixture 143 of indium chloride and gallium chloride from sources 146 and 152 and premix chamber 140. In each of these stages, the metals (Cu, In, Ga) are not allowed to react with the Se until at or on the substrate 114.

Figure 2A:
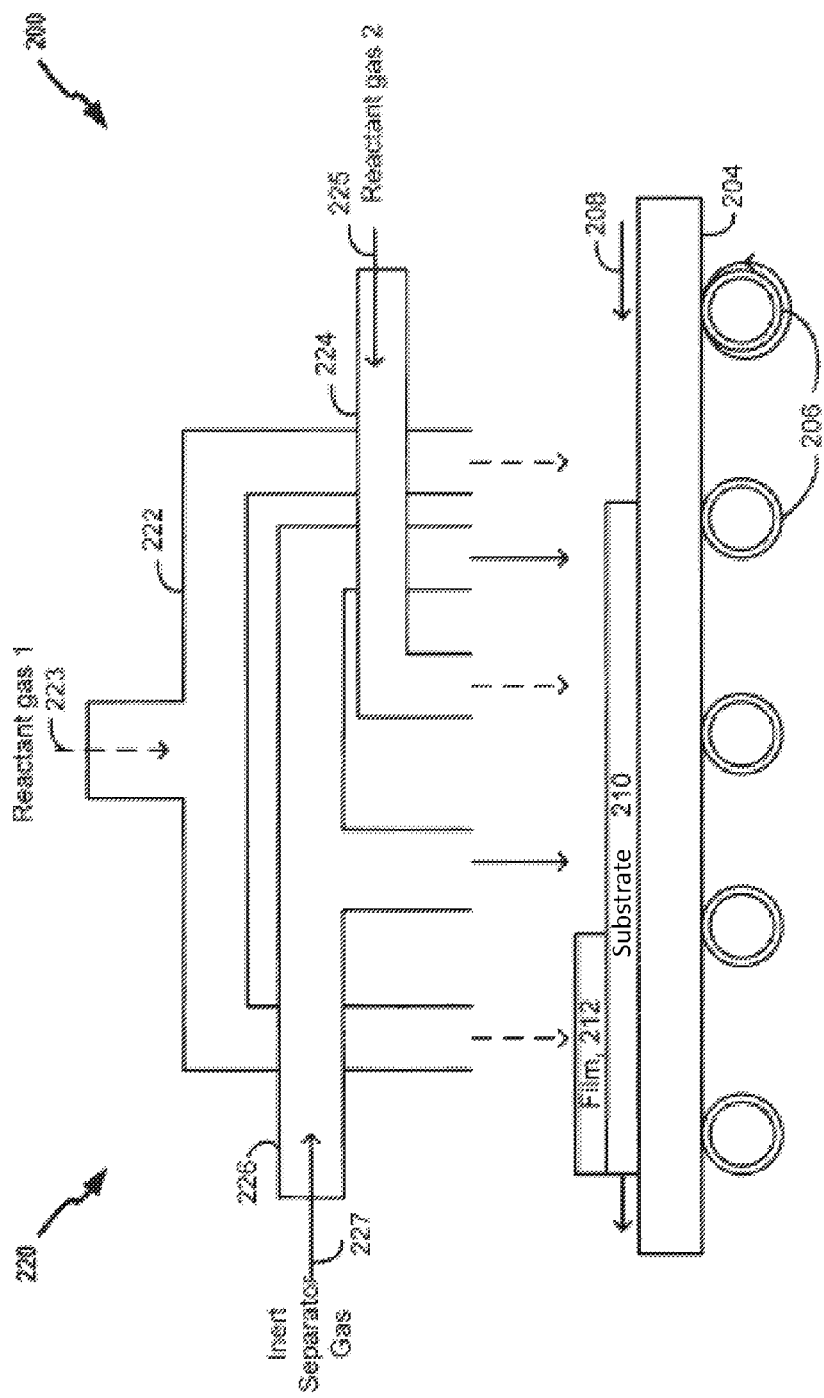
FIGS. 2A-2C illustrate schematically three separate zones or stations of a thin film deposition process useful for forming a CIS or CIGS film using evaporated Cu, In, and Ga chlorides to provide reactant vapors.
Figure 2B:
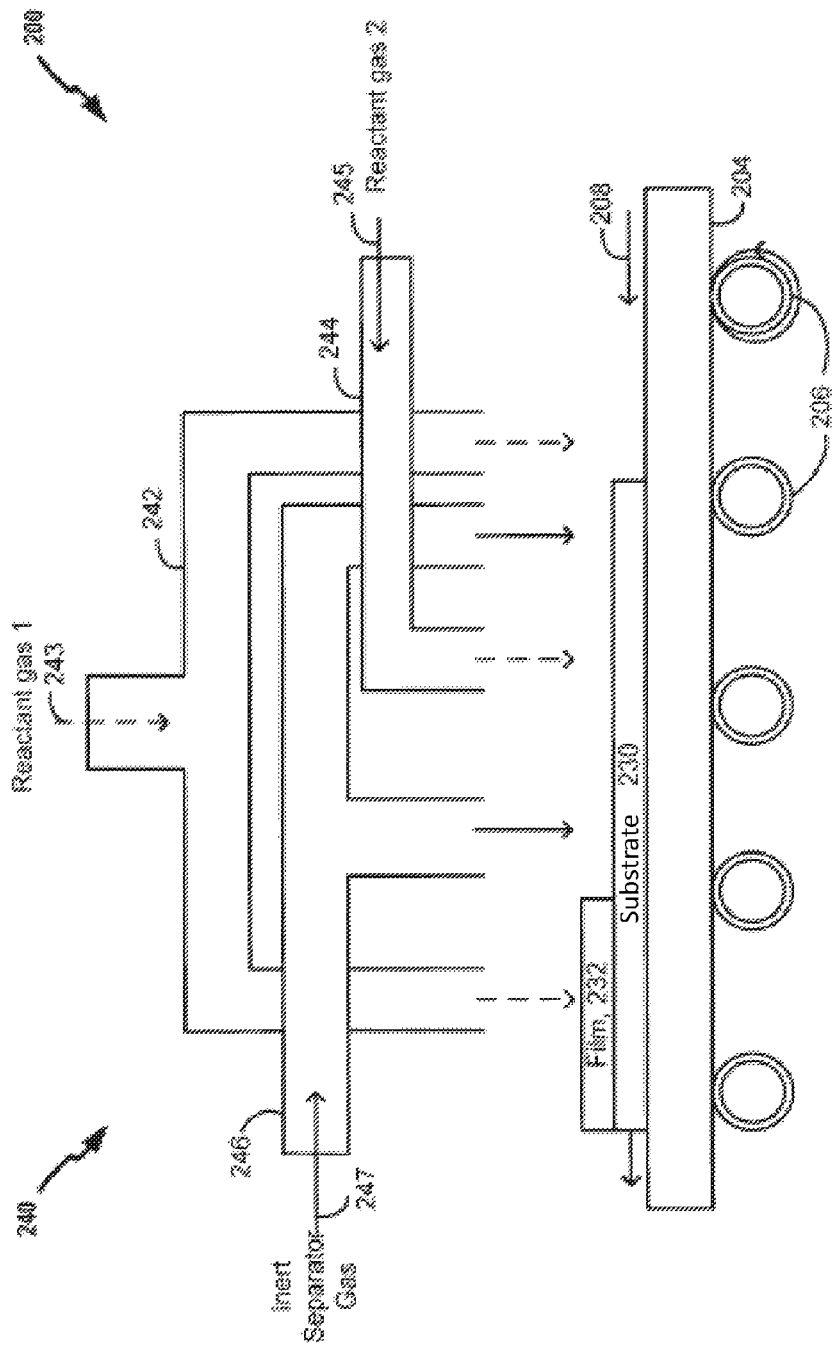
Figure 2C:
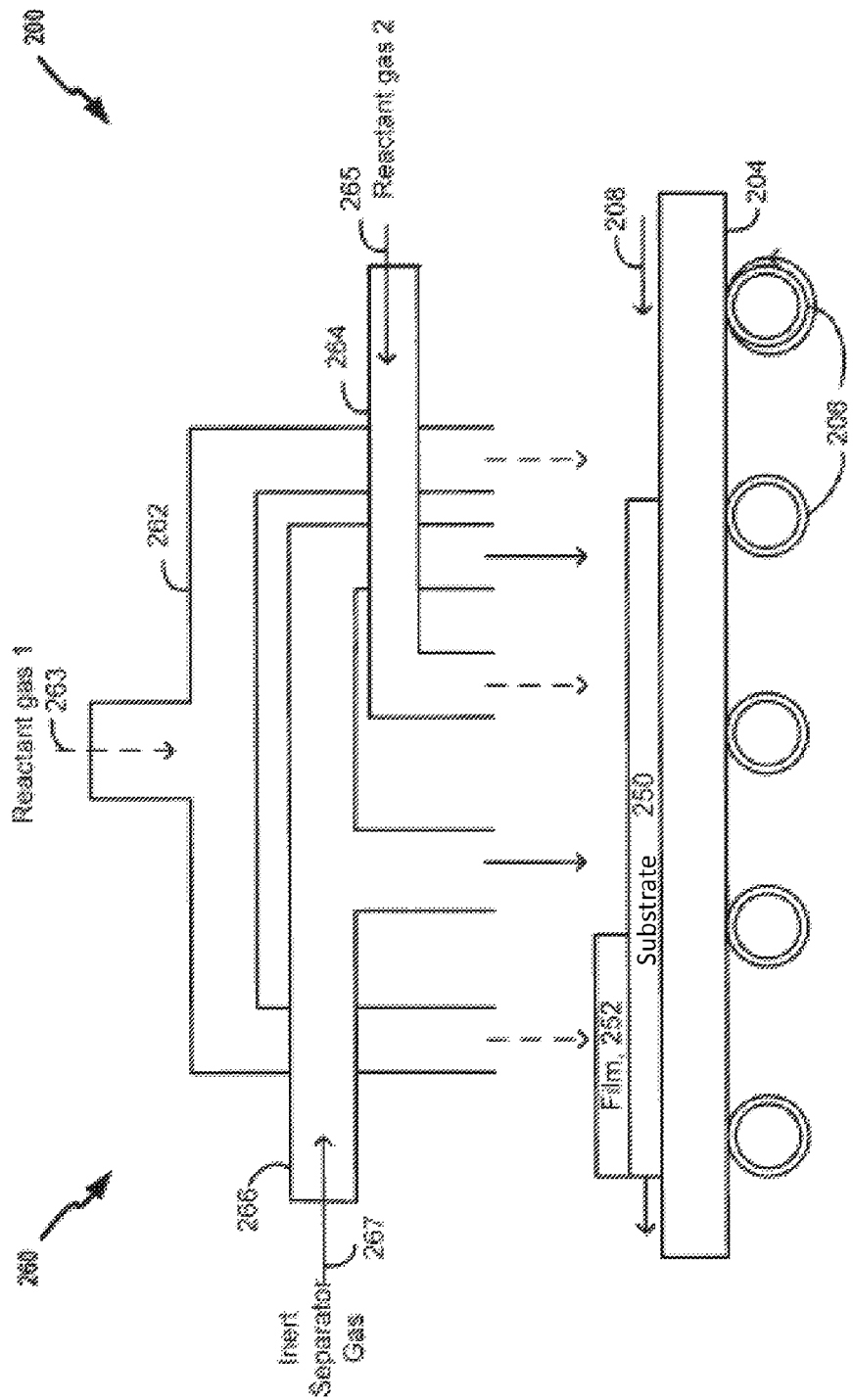

The deposition methods taught herein are particularly well-suited for use in commercial or inline fabrication processes to fabricate solar cells. FIGS. 2A-2C illustrates an inline fabrication system 200 that is provided in three separate zones to perform the 3-step or 3-stage process of inline fabrication of CIS or CIGS films. A belt (or conveyor belt) 204 is supported upon rollers 206 that are rotated to sequentially move the belt 204 through the three deposition zones or stations shown in FIGS. 2A-2C (i.e., FIG. 2A shows a deposition station or zone 1, FIG. 2B shows a deposition station or zone 2, FIG. 2C shows a deposition station or zone 3).

A substrate 210 is positioned on the belt 204 and moves through the system 200 on the belt 204. The substrate 210 provides a structural foundation and may comprise, for example, a glass, a polymeric, a flexible foil substrate with an upper coating or film providing a back contact (e.g., a Mo or similar coating may be deposited upon the substrate 210 prior to it being fed by belt 204 into first zone of FIG. 2A) for a solar cell formed using the substrate 210.

In the first zone shown in FIG. 2A, the substrate 210 is fed into a deposition zone with a deposition or injector assembly 220 that is operated to deposit a film 212 on exposed Mo or similar back contact coating, and the film 212 may be an $In_xSe$ film or an $(In,Ga)_xSe$ film. In either case, an injector 224 is provided to supply a second reactant gas 226 in the form of a selenium vapor, and, optionally, an injector 226 is provided to inject an inert separator gas or vapor 227. In this way, an overpressure of selenium is provided at the substrate 210 and the inert separator gas 227 aid in maintaining the separation of the selenium and other reactant vapors or metals in such vapors (e.g., to block metals such as Cu, In, and Ga from reacting with the Se prior to forming the film 212 on the substrate 210). In some embodiments, though, the film 212 may be formed without the addition of selenium (e.g., the injector 224 providing the second reactant gas 225 may be closed).

The injector assembly 220 further includes an injector manifold 222 with one, two or more outlets above the belt 204 (note, in a lateral injector the openings may be a lateral opening extending across the width of the belt 204 or at least about the width of the substrate 210). To form a film 212 of $In_xSe$, a first reactant gas 223 in the form of indium chloride vapor is provided. To form a film 212 of $(In,Ga)_xSe$, the first reactant gas 223 injected by the injector manifold 222 may be a mixture of indium chloride and gallium chloride. The injector assembly 220 (as well as assemblies 240, 260) are "hot" injectors, and the assembly 220 would include a heater(s) (not shown) to maintain the temperature, $T_{injector}$, of the injectors greater than or about equal to $T_{src}$ so as to avoid condensation (for example, at a predefined level such as a range of 290 to 310° C. or the like).

As shown in FIG. 2B, a second deposition or injector assembly 240 is provided in a next or second zone of the system 200, and the substrate 230 shown being fed on the belt 204 to the assembly 240 is the output of the first assembly 220 (i.e., a substrate 210 upon which an $In_xSe$ or $(In,Ga)_xSe$ film 212 has been formed). The second injector assembly 240 includes an injector 244 providing a second reactant gas in the form of selenium vapor, and it is believed that providing an overpressure of selenium 245 in the injector assembly 240 is desirable for forming the Cu-rich or Cu-poor CIS or CIGS film 232. The assembly 240 may also include an injector 246 providing an inert separator gas 247 to assist in avoiding reactions with the selenium prior to reactions forming the film 232 on the substrate 230 surface.

An injector manifold 242 is provided in the assembly 240 and operated to inject a first reactant gas 243 in the form of copper chloride vapor. Typically, the flow rates of the first and second reactant gases 243, 245 are controlled to cause the deposited film 232 of CuInSe or $Cu(In,Ga)_xSe_2$ to be Cu-rich (e.g., the ratio of Cu to (In+Ga) metals is greater than 1 such as with 26 to 27 at. % Cu or the like).

FIG. 2C illustrates a third zone of the inline system 200 with a third injector assembly 260, and the substrate 250 is the output of the second injector assembly 240 such that it includes a glass substrate with a Mo or similar coating upon which a CIS or CIGS film that is Cu-rich has been formed. The substrate 250 is fed into the injector assembly 260, and a film 252 is formed that preferably includes a Cu-poor or Cu-deficient region on its exposed surface or region. Later solar cell-fabrication steps (not shown) would include forming a n-type film (e.g., a CdS n-type film) and other known steps such as providing a top contact and optional protective glass layers over the p-type absorber provided by the CIS or CIGS film with a Cu-poor region.

The injector assembly 260 includes an injector manifold or injector 262 injecting or providing a first reactant such as a flow of indium chloride vapor in the case of a CIS film or such as a flow of a mixture of indium chloride and gallium chloride vapors. The injector assembly 260 also includes an injector 264 operable to inject a second reactant gas 265 in the form of selenium vapor. Optionally, a third injector 266 may be provided and operated to inject a flow of an inert separator gas 267 to limit the reaction between the In and/or Ga prior to deposition onto the substrate 250 surface (e.g., limit reaction with Se to the film 252). The output substrate 250 with the film 252 can then be moved by the belt 204 to further processing stations to form a solar cell.

Figure 3:
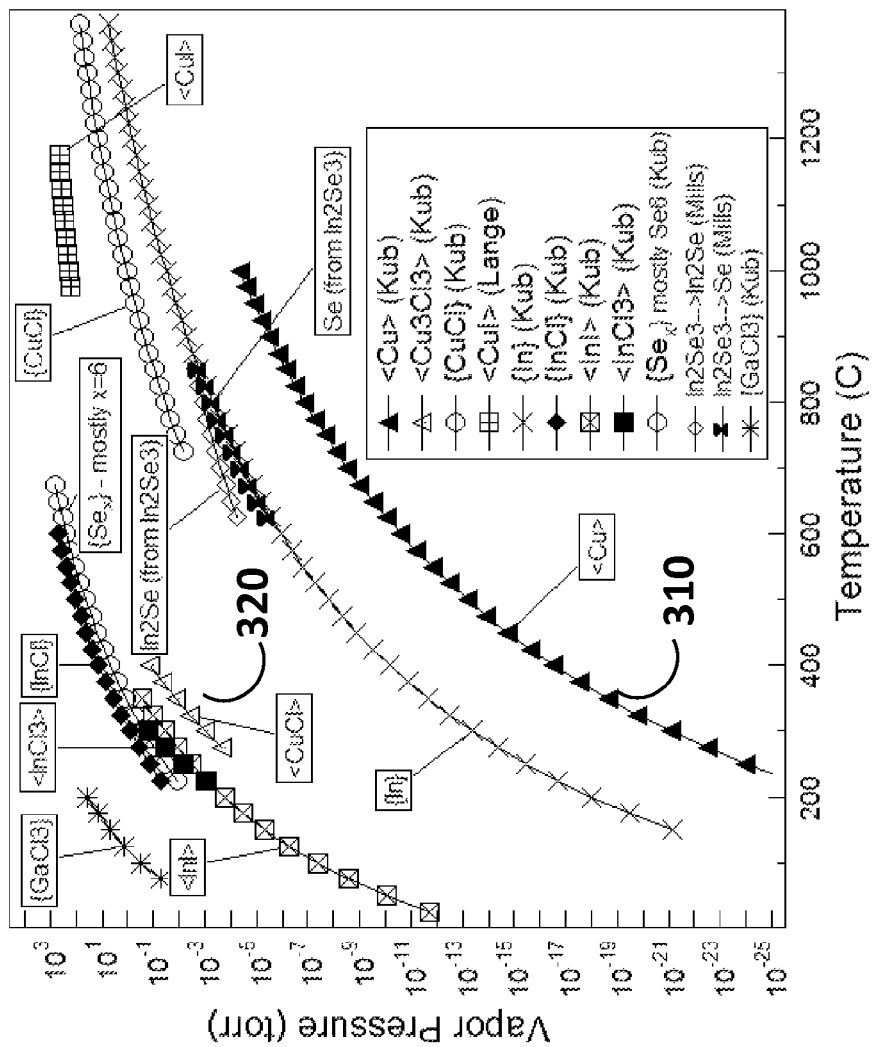
FIG. 3 illustrates a graph or diagram showing vapor pressures versus temperature for a number of materials that may be used in deposition or film growth/formation processes.

FIG. 3 illustrates a graph or diagram 300 illustrating the vapor pressures of a number of materials that one may consider using as part of a thin film deposition or growth process. As shown in FIG. 3, these materials include, but are not limited to: Cu(s), $CuCl_x$(s), $CuCl_x$(l), CuI(s), In(l), $InCl_x$(l), InI(s), $InCl_3$(s), Se(l), $In_2Se_3$(s), $GaCl_3$(l). With regard to the second stage of forming a CIS or CIGS film described herein, it may be useful particularly to inspect the vapor pressures of copper and of copper chloride. With the diagram 300, it can be readily observed with line 310 that copper has a relatively low vapor pressure when compared with that of copper chloride shown with line 320. Particularly, it can be seen that a much higher temperature is required to obtain vapor pressures useful for achieving a desirable growth rate of the CIS or CIGS film. For example, copper has to be raised to a temperature of approximately 1200° C. to match the vapor pressure of copper chloride heat to only 300° C. Recognition of the higher vapor pressures of the chloride source of copper and other metals including indium and gallium when compared with the vapor pressures of elemental sources of metal was one factor that led to the use of these chloride sources in the methods described herein. This also allows use of hot injectors maintained at much lower and acceptable process temperatures.

Portions of the method described in the attached and included U.S. Pat. No. 5,441,897 to Noufi may be utilized to practice aspects of the method of fabricating absorber or CIS/CIGS films for solar cells. Particularly, the method discussed in this patent include: (1) fabricating an $In_xSe$ or $(In,Ga)_xSe$ film; (2) treating this film in Cu+Se vapor to make a slightly Cu-rich CIS or CIGS film; and (3) converting the resulting Cu-rich CIS or CIGS film to a more preferred Cu-poor surface by exposing the film in In+Se or In+Ga+Se vapors. The presently described method of the present disclosure may include these three steps with the substitution of CuCl for elemental Cu as the source for Cu in the second step. CuCl has about a 15 order magnitude higher vapor pressure than Cu as shown in FIG. 3. This higher vapor pressure provides a number of advantages including energy savings due to the lower temperatures required to create a CuCl vapor and much lower operating/deposition temperatures of equipment facilitating its use in inline deposition processes such as those using hot injectors.

Discussion of Experiments

At this point in the description, it may be useful to discuss experimentation and study/research performed to further explain unique aspects of the described method and various ways the method may be implemented in practice. An early experiment involved evaporating CuCl(s) using a conventional evaporator made up of an evaporant boat of CuCl(s). This evaporator configuration was used, in part, to determine the tooling factor calibration of CuCl as an evaporant (for use in forming a CIS or CIGS film). The resulting film varied in thickness from 6300 to 8900 angstrom (A) and was optically transparent (indeed, was invisible due to CuCl being a wide-band gap insulator). Film growth or deposition rates with this reaction chamber were calibrated to A/s. Based on this experiment, it was understood that CuCl could be a wide bandgap replacement for CdS possibly and also be used as a CuCl recrystallization flux, and, it was further principally understood that CuCl could be used as a way to react with Se to form $Cu_xSe$. Also, the result so this experiment that InCl+Se can be used to form $In_xSe$.

In another experiment, an attempt was made to take an existing film of CuCl (e.g., from the above-described experiment) and try to selenize it, i.e., convert it to $Cu_xSe$. $Cu_xSe$ is an intermediate step to form $CuInSe_2$ (CIS), i.e., CuxSe+$In_xSe \rightarrow$CIS. In this experiment, quadrants 3 and 4 of the film from the above-described experiment were used and were heated to a monitor temperature, $T_m$, of ~325° C. for 15 minutes in a flux of Se at ~20 A/s (the calibration curve at this point was $T_{sub}=(1.057 \times T_m)+27$, where $T_{sub}$ is the true substrate temperature and $T_m$ is the monitor temperature. This gives a true substrate temperature of about 370° C. After this run, there was nothing on the substrate, i.e., the CuCl had re-evaporated possibly since the Se flux was not started until the substrate had been raised to the target temperature (e.g., indicating an Se overpressure may be desirable in the formation of a CIS or CIGS film using CuCl vapor as the Cu source).

A follow up experiment was performed to again try to make $Cu_xSe$. Instead of selenizing CuCl films, CuCl and Se were co-evaporated at approximately 15 and 20 A/s, respectively, with the $T_m$ of about 250° C. ($T_{sub}$~290° C.). Final thickness of the CuCl layer transported during the run was noted as ~1 micron, but, surprisingly, there was no film. In a next experiment, approximately 1 micron of CuCl was deposited onto a cold substrate. The substrate was shuttered, and the Se source was brought up to a stable 20 A/s. The shutter was then opened, and the $T_m$ brought up to 250° C. ($T_{sub}$~290° C.) in about 10 minutes and held there for about 10 minutes. In this experiment, the CuCl was heated in a stream of Se to see if $Cu_xSe$ was formed before the CuCl re-evaporated. Unfortunately, it appeared again that there was no film. In another or third follow up experiment, CuCl and Se were co-evaporated at a ratio of Cu:Se of 1:2 in the vapor onto an unheated substrate. Evaporation continued at rates of 10 and 14 A/s, respectively, for enough time to transport enough Cu and Se to form a 2 micron thick CIS film. At the end of this step, the flow of CuCl was turned off, and then the substrate was heated up to a $T_m$ of 250° C. while leaving the Se source on. Again, though, there did not appear to be a noticeable or useful film.

At this point in the process, it may be useful to provide a brief description of some of the additional considerations or factors that were considered in designing a useful method for forming a CIS or CIGS film using CuCl vapor for mass transport. Particularly, it was recognized that the experimental results were showing that forming $Cu_xSe$ was going to be difficult with CuCl as the source. Thermodynamically, there is a way to react CuCl and selenium to form $Cu_xSe$, but it involves the mono-selenide as a reactant. When Se is heated up, there is a distribution of iomers of $Se_x$ where x=1, 2, 3, 4, etc. The enthalpy of reaction for Se(gas) is more positive (56.25 kcal/mole) than $Se_2$(gas) (33.3 kcal/mole).

The following reactions may be considered: (1) 2CuCl(solid)+$Se_2$(gas)$\rightarrow$2CuSe(solid)+$Cl_2$(gas) and (2) 2CuCl(solid)+2Se(gas)$\rightarrow$2CuSe(solid)+$Cl_2$(gas). It can be seen from these reactions that: (1) the enthalpy of reaction for the first is positive, i.e., (2)(−10,000)−{(2)(−32,800)+(1)(33,300)}=positive; and (2) the enthalpy of reaction for the second is negative, i.e., (2)(−10,000)−{(2)(−32,800)+(2)(56,250)}=negative. From thermodynamic principles, if a reaction enthalpy is negative, the reaction is possible. Thus, fundamentally, viable reaction pathways for forming CIS and CIGS involve negative enthalpies of reaction. With regards to forming $Cu_xSe$ using CuCl and Se, the type of selenium species is important. If Se can be reduced to a monomer of just Se (perhaps through some type of surface catalysis or decomposition of higher-order Se molecules, for instance reactivity between $MoSe_2$ and $CuCl_x$ might also play a role), then the reaction is favored.

This led to an understanding that forming CIS via the reaction pathway of first forming $Cu_xSe$ followed by reacting this with $In_xSe$ to make CIS may be difficult. So now, the questions faced are: (1) whether $In_xSe$ can be formed by reacting $InCl_3$ with Se, and (2) whether $In_xSe$+CuCl can be sequentially reacted to form CIS. With regards to the first question, a good aspect is that the heat of formation of $In_2Se_3$ is highly exothermic, such that the same calculations above for forming $In_2Se_3$ by reacting InCl with Se (either as Se(gas) or $Se_2$(gas)) are both favorable. Thus, problems were not expected with forming $In_xSe$ because the more exothermic the reaction product, the more likely it forms. The heat of formation for $In_2Se_3$ is very exothermic at −78,000 cal/mole in contrast to forming the CuSe which is only −10,000 cal/mole. Note that the most favorable form of In chloride to use likely will be InCl (solid) relative to either $InCl_2$ or $InCl_3$.

Hence, the only remaining question is whether $In_xSe$+CuCl reacted to form CIS is favorable. Significantly, one does not even need to reduce higher-order Se molecules to the (Se) phase in order to make the reaction favorable (note, though, doing so, i.e., converting $Se_x$ (where x=2, 3, 4, etc.) to Se will always drive the reaction to be more favorable). Rather, it may be possible to do so, by controlling the Se-concentration in the $In_xSe$ phase alone. For example, the reaction of CuCl with $In_2Se_3$ and excess $Se_2$ is not favored. However, the reaction of CuCl with InSe and excess $Se_2$ is thermodynamically favored. This is an interesting aspect as the activity of selenium is present not only in the vapor phase (again, Se is generally better than $Se_2$), but also in the solid $In_xSe$ phase (InSe may be the preferred starting composition). With this discussion of thermodynamic aspects of the deposition or growth of a film using CuCl understood, it may now be useful to return to further experimentation performed based on such recognition by the method designer.

At this point, it would seem difficult to drive the reaction of mixing CuCl and Se to form $Cu_xSe$ possibly due to the limitation of reducing the $Se_2$ to the Se monomer state. The substrate molybdenum or bare glass surface may not provide the type of reduction chemistry to drive $Se_2 \rightarrow Se$. With this in mind, the research direction was altered towards using and improving aspects of the 3-stage process described in the attached/included U.S. Pat. No. 5,441,897 to Noufi. In this patented process, the first step is to grow a layer of $In_xSe$. There is little concern with the thermodynamics of this step such that experiments concentrated on the second step of the 3-stage process, i.e., reacting $In_xSe$ with CuCl to form CIS.

An initial run or experiment was performed to determine the crosstalk of CuCl flux on an In-monitoring deposition crystal. Knowledge of this crosstalk is useful in order to use the In-monitoring deposition crystal to monitor the $In_xSe$ deposition rate. Further, a calibration run or experiment was performed for evaporating $In_xSe$ powder from a boat. This sets the tooling factor so that the $In_xSe$ deposition rate is known or readily determined.

With these calibration-type experiments completed, another experiment was performed that involved co-evaporating CuCl+$In_xSe$ and Se onto a molybdenum coated substrate ($T_m$) heated to about 450° C. Deposition time was about 12 minutes. The rates used were CuCl at 12-15 A/s, $In_xSe$ at 20 A/s, and Se at 25-30 A/s. This is a higher than normal overpressure of Se relative to previous runs. The resulting film appeared to be a useful CIS film. Resistance varied from 120 Mohm down to 0.147 Kohm suggesting compositions were straddling Cu-poor to Cu-rich, respectively. Targeted thickness was 2.3 microns while actual thickness was 2.1 micron suggesting good incorporation of Cu, In, and Se.

Actual measured compositions were somewhat Se-deficient as films became Cu-rich suggesting some process tweaking may be desirable. Measured composition at 3 points along the gradient showed: Cu (at. %)/In (at. %)/Se (at. %)=27.02/20.33/52.65; 35.25/18.91/45.84; and 50.75/9.55/39.70. At the time of the experimental run, it was believed that the compositional variations may have been due to issues in attempting to uniformly heat the substrate.

This experiment was then repeated to attempt to get tighter control. In the experiment, CuCl, $In_xSe$, and Se rates were 10-14, 20-25, and 25-29 A/s, respectively. The substrate temperature was at $T_m$=490-500° C., which was somewhat higher than the prior experiment. The resulting or entire film appeared to be Cu-rich from resistance measurements, even though the Cu/In ratio for this experiment was less than what it was for the prior run. Apparently, therefore, higher temperature appears to drive off indium from the film. Interestingly, whereas there had been prior difficulty in incorporating Cu with Se in experiments the early experiment, with beginning with the prior experiment, the experiments showed that it was possible to incorporate Cu in the film. However, these first two experiments (after the thermodynamic study or analysis) were more about incorporating CuCl and $In_xSe$ together rather than sequentially.

In a later experiment, the film from the previously-discussed experiment (which was essentially a Cu-rich, CIS film) was subjected to a flux of $In_xSe$+Se to see if the film could be made Cu-poor. Basically, this was an attempt to replicate the third step of the 3-stage process but after use of CuCl as a source for making a Cu-rich film (e.g., making a Cu-rich film, Cu-poor by treating it in $In_xSe$+Se vapor). In this experiment, part of the film was heated to a temperature, $T_m$, of 500° C., in a flux of $In_xSe$ (10 A/s) and Se (20 A/s). The film still appeared to be Cu-rich. It was believed at this time that perhaps not enough $In_xSe$ was used. The $In_xSe$ flux occurred during the initial time at $T_m$=500° C. After 10 minutes, the $In_xSe$ flux was turned off, but the Se flux was kept on while the substrate cooled to about $T_m$=300° C. It was estimated that about 2840 A of $In_xSe$ was used during this anneal, and, hence, a conclusion was that possibly this amount was not enough to convert the Cu-rich CIS to Cu-poor CIS.

In a next experiment, another run was performed involving the co-evaporation of CuCl (10-13 A/s), $In_xSe$ (20-25 A/s), and Se (very high; 35-40 A/s), at a $T_m$=500° C. When turning off sources, the CuCl source drops faster than the In source; thus, the surface of the CIS appears to terminate with more of an In-flux. The film composition came in at 11.83/32.63/55.54, which is very close to the 1:3:5 (ordered-vacancy-compound, OVC) phase. At the time, this phase was suspected as being a desired "Cu-poor" phase for making good CIS devices, and it was likely that the higher Se overpressure was useful and possibly even necessary in some cases for making this phase.

Another run or experiment was performed involving co-evaporating CuCl, $In_xSe$ and Se again at a $T_m$ of about 470° C. (slightly cooler) but with Se dropped down to only 25-30 A/s. Cu and In rates were 10-13 and ~20 A/s respectively. Again, the CuCl rate dropped off faster at the end of run. The resulting film turned out to be Cu-rich, and part of this film was set aside to study whether subsequent $In_xSe$ treatments could make it Cu-poor. Note that the Se activity appears to affect the Cu/In ratio more than temperature. A lower substrate temperature (based upon results of earlier experiments discussed above) would have suggested this film to have been Cu-poor. Rather, it was Cu-rich, and a plausible explanation is that, in the case of this experiment compared to the immediately previous one, it was the lower Se flux that caused this film to be Cu-rich.

In the next experiment, the run involved another co-evaporation of CuCl, $In_xSe$, and Se. This time at $T_m$=475° C. and Cu, In, and Se rates of ~10, ~20, and 30 A/s. This film showed a Cu-rich to Cu-poor gradient. Again, there was a strong indication that the Se rate and substrate temperature determine the ability of the CuCl to combine with $In_xSe$ vapor to form either Cu-rich or Cu-poor CIS.

The next experiment involved a treatment of the previously saved film (which had been strongly Cu-rich) in a flux of $In_xSe$+Se vapor to make it Cu-poor. The Se flux was brought up to ~20 A/s first, followed by the $In_xSe$ flux up to about 10 A/s. Using a witness slide (a bare glass substrate placed next to X16), it was determined that about 5000 A of $In_xSe$ had been deposited during this treatment. The resulting film showed a gradient of Cu-poor (resistance=17 Mohm) to Cu-rich (160 ohm) CIS. Note that this is an experiment similar to the one discussed above where an attempt was made to replicate the third step of the 3-stage process (i.e., making a Cu-rich film, Cu-poor by treating it in $In_xSe$+Se vapor). In the prior experiment, only 2840 A of $In_xSe$ was used whereas in contrast in this experiment this has been doubled to about 5000 A. Thus, the conclusions from the prior experiment (that not enough $In_xSe$ was used) appear to have been warranted. Hence, at this point in the experimentation, the conclusion was that the third step of the 3-stage process described in U.S. Pat. No. 5,441,897 could work with the modifications described herein, i.e., a Cu-rich CIS film made using CuCl can be effectively converted into a Cu-poor CIS film for use as an absorber in a solar cell.

In the next experiment, an attempt was made to replicate the second step of the 3-stage process but with the unique modifications described herein. From the prior experiment, the third step was shown possible, and, again, as discussed in with regard to the thermodynamics of the film fabrication above, the first step is likely readily achievable. Hence, all that remained was determining whether the second step is possible (i.e., converting an $In_xSe$ film into a Cu-rich CIS film).

To this end, a film of $In_xSe$ was deposited on the substrate by depositing from an $In_2Se_3$ source at 10 A/s for ~23 minutes to grow an $In_xSe$ film with a thickness of about 14,000 A. This was done simultaneously with a flux of Se at 18-20 A/s. The substrate was held at 200° C. during this step. Without breaking the vacuum in the reaction chamber, the $In_2Se_3$ source was turned off, and the CuCl source was brought up to a rate of about 6 A/s. At the same time, the substrate (now coated with $In_xSe$) was heated to a $T_m$=480° C. The CuCl flux was maintained for about 22.7 minutes for a total Cu transport of 8180 A at which point the CuCl source was turned off and the film was allowed to cool in a flux of Se to about 300° C. This film was Cu-poor and the XRD showed strong OVC (i.e., Cu-poor CIS) phase formation.

Since the film from the prior experiment was Cu-poor, but the second stage of the 3-stage or step CIS or CIGS film formation process prefers (but does not require) a film that is Cu-rich, a way was needed to increase Cu in the film. In the prior experiment, relative thicknesses of $In_xSe$ and CuCl used during the first and second steps were 14,000 A and 8100 A, respectively, for a Cu/In ratio of 0.578. In the following two experiments, these thicknesses were adjusted for ratios of 0.73 and 0.76, respectively, in order to increase the amount of Cu. For the first of these two follow up experiments, the Se rate was reduced during the second step while also reducing CuCl flux to 15-16 A/s. It appears that the films produced in these two experiments remained Cu-poor though the second follow up experiment did show towards one side of the film a slightly lower resistance suggesting that progress was being made toward getting the films to be Cu-rich.

At these conditions of temperature and Se overpressure, it was a bit difficult to incorporate Cu, i.e., the composition tended to terminate towards a Cu-poor material. These results combined with the strong observations of OVC phases suggested that some tuning of the process could be used to terminate a Cu-poor surface (useful for the third stage of the process). From a manufacturing perspective, this could be an advantage, particularly when Cu-poor surfaces are desired.

In a later experiment, the temperature, $T_m$, was increased during the CuCl treatment as well as an increase of the CuCl flux to make the film more Cu-rich. A temperature $T_m$ of 500-510° C. was used, and a Cu/In thickness ratio of 1.16 was set. The experiment produced or made the film Cu-rich. The results of this experiment may have been achieved due, in part, to the slightly higher temperature, but it is more or just as likely the much greater ratio of Cu/In that caused the film to be more Cu-rich.

Since the above experiments proved that a good Cu-rich film (after stage 2) can be readily produced using CuCl vapor, the experiment can be continued to introduce the third stage (treatment with $In_xSe$ to make film again Cu-poor). Part of the film from the prior experiment (quadrants 3, 4) were heated up to $T_m$=300° C. Then, the Se was brought up to 20 A/s while continued heating up the substrate to $T_m$=505° C. The process was continued for 2 minutes, and then the $In_2Se_3$ source was turned on to about 5 A/s and transferred about 2510 A of $In_xSe$ at $T_m$=505° C. Also, the experiment used Se at 19-20 A/s. A similar experiment was run but used remaining part of the film (quadrants 1, 2) and treated with 1255 A of $In_xSe$ at $T_m$=510° C. Used same procedure of raising temperature of film to 300° C., turning on and stabilizing the Se source, continuing to heat to 510° C. at which point the $In_2Se_3$ source was brought up to 4-5 A/s. This experiment may not have provided enough $In_xSe$ treatment, so it was repeated with an additional 1000 A of $In_xSe$ flux.

A later experiment involved a repeat of the process involving first, the deposition of a 18,860 A $In_xSe$ film at $T_m$=230-240° C. (this time with no Se; thermodynamically, InSe is better than $In_2Se_3$) followed by a CuCl+Se treatment at $T_m$=510° C. During this experiment, 8249 A of CuCl was transported during the latter step. Both the CuCl and $In_xSe$ amounts are greater this time since the experiment was targeting a 2.5 micron film. The amount of Cu used in this run, should have made the film slightly Cu-poor, but, again, it was Cu rich, suggesting some In loss in the process. This experiment was followed by preparatory calibration runs for use of $Ga_2Se_3$, $In_2Se_3$, and CuCl to form films as discussed in the methods described herein.

In another later experiment, stages 1 and 2 of the three stage process were performed, but the resulting film was mostly Cu-poor. The first stage involved 14,000 A of $In_xSe$ film deposited at $T_m$=240-250° C. at 5-6 A/s. There was no Se during this step. The film was then raised to 510-515° C., Se brought up to 25 A/s, and CuCl was brought up to about 5 A/s. Approximately, 8003 A of CuCl was transported. The Se source was maintained for 2 min after the CuCl was turned down. The film was mostly Cu-poor though there was a gradient. These resulted in active cells with moderately good (~6%) efficiency.

In another experiment, cells were produced using an absorber formed using CuCl that were good efficiency. These involved stages 1-3 of the three stage process. In this experiment, 14,000 A of $In_xSe$ was first deposited at a $T_m$=240-250° C. at 5-6 A/s without Se. Then the temperature was increased to $T_m$=514-515° C., and CuCl and Se sources increased to 5 A/s and 20 A/s, respectively. The method of the experiment included transporting 9040 A of CuCl during this step. Then, without changing temperature, turning off both CuCl and Se, turning on the $In_2Se_3$ source to 5 A/s, and transporting another 1730 A of $In_xSe$, thereby converting the Cu-rich CIS back to Cu-poor. Then, the experimental method included turning off the $In_2Se_3$ source, bringing the Se back up to ~15 A/s, and cooling the substrate to about 300° C., and then shutting down the system (turning all devices off). These substrates with the CIS films made good solar cells.

At the end of this experimental and testing work, working solar cells had been made using only the first and second stages (where the resulting film surface was Cu-poor) and also using the first, second, and third stages, where after the second stage the film surface was Cu-rich.

While a number of exemplary aspects and embodiments have been discussed above, those of skill in the art will recognize certain modifications, permutations, additions, and sub-combinations thereof. It is therefore intended that the following appended claims and claims hereafter introduced are interpreted to include modifications, permutations, additions, and sub-combinations to the exemplary aspects and embodiments discussed above as are within their true spirit and scope.

During experimentation in which many aspects of the above describe method were designed or discovered, it was first documented that CIS thin films could be grown in a closed-space sublimation (CSS) arrangement using various compounds containing Cu, In, and Se. Some preliminary materials (e.g., $Cu_xSe$, $In_xSe$, and Se) were identified as well as some not-so-well known material possibilities (CuCl, CuBr, $Cu(C_2H_3O_2)_2$, CuF).

Subsequent experimentation or work involved testing out the use of CuCl as a volatile Cu-transporting agent for such processes by simulating different reaction pathways in a conventional multi-source evaporator. CIS was successfully fabricated using $In_xSe$ precursors and CuCl vapors. The high volatility of CuCl tended to make the films Cu-deficient, which is preferred for making CIS-based devices including solar cells. Subsequent reaction pathways included the co-evaporation of CuCl with $In_xSe$ and Se to directly form Cu-poor CIS films, and the direct conversion of $In_xSe$ precursors with subsequent treatments in CuCl vapor.

Cu-rich films fabricated by using CuCl were also converted to Cu-poor films using two-step approaches using $In_xSe$ vapors. Cell performance during many subsequent experiments reached about 7 percent. Though experiments to date were not performed in a Close Spaces Sublimations (CSS) arrangement, experiments were designed to test the feasibility of growing CIS using sources other than elemental Cu, In, and Se in particular as might be applied to a CSS-like arrangement. CSS represents a much faster method for depositing CIS films and in its related form, i.e., vapor transport, has been shown to be manufacturable at a very high scale (e.g., vapor transported CdTe). This work is believed to be the first conceptualization of CIS formation by CSS and vapor transport processes reduced to actual practice including production of working solar cells.

The above described methods and/or designs may involve separating Reactant gas 1 (which may be $CuCl_x$, $InCl_x$, and/or $GaCl_x$) from Reactant gas 2 (which may be Selenium). It is expected that an embodiment of a deposition or growth method may also (or alternatively) involve mixing Reactant gases 1 and 2 prior to their "hitting" the substrate. Scientifically speaking, mixing Reactant gases 1 and 2 may lead to "homogeneous" nucleation and growth of selenide solids in the gas phase. This is often undesirable when the intent is to have these selenide solids nucleate heterogeneously on the substrate. In other words, homogenous nucleation may lead to "dusting", or essentially coating the substrates with a dust instead of a film of selenides. However, it is recognized that it is may be possible to pre-mix Reactant gases 1 and 2 and simply use a single injector. The small-scale system (shown in FIG. 1) will allow further study of these effects.

It may be useful at this point to further discuss the specific stoichiometries that may be utilized. With the exception of the chemical formulas given, the stoichiometry of phases is always questionable. However, if one is working with a source, it may be appropriate to specify the stoichiometry of the source (i.e., $In_2Se_3$ or $Cu_2Se$) since this is information stated on a label on the bottle or other container from a distributer or provider. However, in a film, it typically is presumptuous to specify the film as $In_2Se_3$ or the like since films are rarely single-phase, i.e., a film that is predominately $In_2Se_3$ probably contains other $In_xSe$ phases. Thus, the above discussion often does not to specify the stoichiometry of the resulting or produced $Cu_xSe$ or $In_xSe$ films and vapors. It is preferable to use the more general use of "x" when it comes to the condensed, deposited film or the evaporated vapor.

The methods described herein may include flowing gallium chloride over the film concurrently with flowing the copper chloride. The experimental and much of the other discussion above stressed manufacture of films and devices using CuCl. However, the use of In and Ga chlorides to do the same or provide a similar functionality (e.g., for forming GaxSe, InxSe, and (In,Ga)xSe films) is likely to be easier based on the thermodynamic calculations (e.g., likely to be useful since CuCl has been successfully be used to form films).

Hence, it should be understood that the film deposition methods are clearly not limited to exposing $In_xSe$ or (In, Ga)$_x$Se films to $CuCl_x$, but the implementations of the method may include: (1) first forming a $In_xSe$ or $(In,Ga)_xSe$ film on Mo/Glass using $In_xCl$ or $In_xCl+Ga_xCl$ vapors (both with or without Se vapor) (i.e., this is the 1st stage); (2) second making a Cu-rich film by treating this film in $CuCl_x$ (with or without Se vapor) to form a Cu-rich CIS or CIGS film (i.e, this is the 2nd stage); and (3) exposing the last film to a final treatment of either $In_xCl$ or $In_xCl+Ga_xCl$ vapor (both with or without Se vapor) (e.g., this is the 3rd and, typically, final stage).

Process temperature ranges may vary to implement the methods discussed herein. For example, approximate temperatures that may be used to heat the CuCl, $InCl_x$, $GaCl_x$, and Se sources are 375, 300, 175, and 300° C. respectively. The premix chamber is generally only used to mix the In and Ga sources. It generally will be heated to at least about 300° C. (e.g., the temperature useful with the less volatile Indium). Since this same premix chamber may also pass the CuCl source, it could be set to a temperature of about 375° C. (e.g., the temperature useful for CuCl).

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations.

What is claimed is:

1. A method for fabricating a thin film device, the method comprising:
    during a first stage, performing a mass transport of indium through vapor transport of an indium chloride vapor concurrently with a selenium vapor to deposit a semiconductor film upon a substrate, while injecting an inert gas between the selenium vapor and the indium chloride vapor;
    heating the substrate and the semiconductor film to a desired temperature; and
    during a second stage, performing a mass transport of copper through vapor transport of a copper chloride vapor concurrently with the selenium vapor to the semiconductor film, while injecting the inert gas between the selenium vapor and the copper chloride vapor.

2. The method of claim 1, wherein the semiconductor film comprises one of $In_xSe$ or $(In,Ga)_xSe$.

3. The method of claim 1, where the heating comprises heating the substrate to a temperature in the range of 475 to 600° C. prior to the vapor transport of the copper chloride vapor.

4. The method of claim 1, wherein the second stage is performed until the semiconductor film includes a copper-rich region.

5. The method of claim 1, where the copper chloride is a species of the form $Cu_yCl_x$, where x>0 and y>0.

6. The method of claim 1, further comprising:
    during a third stage, performing the mass transport of indium through vapor transport of the indium chloride vapor concurrently with the selenium vapor to the semiconductor film, while injecting the inert gas between the selenium vapor and the indium chloride vapor.

7. The method of claim 6, further comprising:

during the third stage, performing a mass transport of gallium through vapor transport of a gallium chloride vapor concurrently with the indium chloride vapor and the selenium vapor to the semiconductor film.

8. The method of claim 6, wherein:

during the first stage, injecting the inert gas between the selenium vapor and the indium chloride vapor regulates a rate of reaction between the indium chloride vapor and the selenium vapor prior to deposition on the substrate;

during the second stage, injecting the inert gas between the selenium vapor and the copper chloride vapor regulates a rate of reaction between the copper chloride vapor and the selenium vapor prior to deposition on the substrate; and during the third stage, injecting the inert gas between the selenium vapor and the indium chloride vapor regulates the rate of reaction between the indium chloride vapor and the selenium vapor prior to deposition on the substrate.

* * * * *